US010267612B2

United States Patent
Muller et al.

(10) Patent No.: US 10,267,612 B2
(45) Date of Patent: Apr. 23, 2019

(54) BOOSTER COMPRISING A PRINTED ELECTRONIC CIRCUIT

(71) Applicant: DETNET SOUTH AFRICA (PTY) LTD, Woodmead, Johannesburg (ZA)

(72) Inventors: Elmar Muller, Johannesburg (ZA); Francois Venter, Johannesburg (ZA)

(73) Assignee: Detnet South Africa (Pty) Ltd, Johannesburg (ZA)

( * ) Notice: Subject to any disclaimer, the term of this patent is extended or adjusted under 35 U.S.C. 154(b) by 46 days.

(21) Appl. No.: 15/531,183

(22) PCT Filed: Nov. 9, 2015

(86) PCT No.: PCT/ZA2015/050021
§ 371 (c)(1),
(2) Date: May 26, 2017

(87) PCT Pub. No.: WO2016/086241
PCT Pub. Date: Jun. 2, 2016

(65) Prior Publication Data
US 2018/0306565 A1    Oct. 25, 2018

(30) Foreign Application Priority Data
Nov. 28, 2014  (ZA) .................................. 14/08748

(51) Int. Cl.
*F42D 1/05*    (2006.01)
*F42B 3/12*    (2006.01)
(Continued)

(52) U.S. Cl.
CPC ................ *F42D 1/05* (2013.01); *F42B 3/121* (2013.01); *H05K 1/0284* (2013.01); *H05K 1/16* (2013.01);
(Continued)

(58) Field of Classification Search
CPC .......... F42D 1/05; H05K 1/0284; H05K 1/16; H05K 3/0058; H05K 2201/056; H05K 2201/09063; H05K 2201/0999
(Continued)

(56) References Cited

U.S. PATENT DOCUMENTS 8,573,123 B1    11/2013   Fuchs et al.
2014/0328036 A1    11/2014   Sarraf et al.

FOREIGN PATENT DOCUMENTS

EP    2678633    1/2014
WO    WO 2012/114251 A1 *    8/2012

OTHER PUBLICATIONS

International Search Report and Written Opinion for Application No. PCT/ZA2015/050021 dated Aug. 17, 2016 (14 pages).
(Continued)

*Primary Examiner* — Samir Abdosh
(74) *Attorney, Agent, or Firm* — Michael Best & Friedrich LLP

(57) ABSTRACT

A booster component which includes a booster housing for a booster explosive material and a printed electronic circuit which is associated with the housing and which includes a module for harvesting energy emitted by an energy source, a storage device for storing energy harvested by the module, an igniter and a circuit, powered at least by energy drawn from the storage device and responsive to a control signal for firing the igniter.

20 Claims, 3 Drawing Sheets

(51) Int. Cl.
  *H05K 1/02* (2006.01)
  *H05K 1/16* (2006.01)
  *H05K 3/00* (2006.01)
(52) U.S. Cl.
  CPC ..... *H05K 3/0058* (2013.01); *H05K 2201/056* (2013.01); *H05K 2201/09063* (2013.01); *H05K 2201/0999* (2013.01)
(58) Field of Classification Search
  USPC ........................................................ 102/206
  See application file for complete search history.

(56) References Cited

OTHER PUBLICATIONS

International Preliminary Report on Patentability for Application No. PCT/ZA2015/050021 dated Mar. 27, 2017 (12 pages).

* cited by examiner

BOOSTER COMPRISING A PRINTED ELECTRONIC CIRCUIT

BACKGROUND OF THE INVENTION

This invention relates to a booster for use in an explosive system.

A typical booster includes a housing which is loaded with explosive and means whereby the booster can be coupled or exposed to a detonator which, when fired, ignites the explosive.

One type of detonator used with a booster is an electronic detonator. Such detonators come in different shapes and forms. Generally an electronic detonator is built on a printed circuit board making use of an application specific integrated circuit (ASIC) which is used to implement control and firing functions. Provided the ASIC is produced in an extended production run the use thereof is cost effective. However, once an ASIC has been committed to manufacture it is often not viable to make modifications to the basic circuit.

As an alternative approach detonator control circuits are implemented on printed circuit boards (PCBs) using discrete components. A product produced in this way is robust and readily available, and can be adapted with relative ease to suit specific requirements. However, the board which is used for the printed circuit is rigid and cannot be bent nor easily manufactured in a complex geometric shape. Additionally PCB technology is sensitive to environmental factors such as moisture.

An object of the present invention is to provide a booster which can make use of a different type of detonator which is not subject to the aforegoing constraints.

SUMMARY OF THE INVENTION

The invention provides, in the first instance, a booster component which includes a booster housing for a booster explosive material and a printed electronic circuit which is associated with the housing and which includes a module for harvesting energy emitted by an energy source, a storage device for storing energy harvested by the module, an igniter and a circuit, powered at least by energy drawn from the storage device and responsive to a control signal for firing the igniter.

As used herein "printed/printable electronic circuit" means a circuit including carbon-based (organic) ink components that are printed on a non-conductive surface or a circuit formed by metal oxide deposits on a flexible (amorphous silicon) substrate or a combination of metal oxide and carbon-based technologies.

At least part of the printed electronic circuit could be printed directly onto a surface of the booster housing. The surface may be an inner surface or an outer surface of the booster housing (in use).

Alternatively the printed electronic circuit may be printed on a substrate which, preferably, is flexible and which is attached, as required, to the booster housing, or which forms part of the booster housing.

A particular benefit of the use of a printed electronic circuit is provided by a capability of the substrate, which carries the circuit, to be flexible or of a compound shape.

The energy source may be a light source. The invention is not limited in this respect. The energy source may be provided by light which is transmitted by a shock tube which is ignited, or via a fibre-optic lead, or the like.

For the printed electronic circuit to function effectively it is essential to have sufficient energy available. The provision of an adequate amount of energy requires an appropriately rated energy-harvesting module. Thus the harvesting module may have a relatively large area which is determined so that sufficient energy is produced when the module is exposed to light transmitted for example by a shock tube or by a fibre-optic component as the case may be.

The energy-harvesting module may be of any suitable kind and, if responsive to light energy, may comprise a photovoltaic cell or a plurality of photovoltaic cells configured to extract a maximum amount of light energy, for a given area, from a light source.

For example a suitable configuration may comprise a photovoltaic cell configured to be exposed to a shock tube which is passed over the cell and which follows a path whereby an increased quantity of light is emitted by the shock tube to the cell. A similar consideration may apply in respect of a fibre-optic component, or any other light-emitting device.

It is possible to overlie the photovoltaic cell with a film or layer of a light conductive material into which light, emitted by the energy source, is transferred. The boundaries of the film are preferably such that they do not readily allow light to escape from the film with the consequence that light, in the film, is internally reflected and a maximum amount of light is then extracted from the film by the photovoltaic cell.

The device for storing the harvested energy may be a printed electronic rechargeable cell, a battery of cells, a super capacitor, or a "conventional" electrical cell. The energy storage device may store the energy for a limited period of time during which period a booster, associated with the booster component, completes its mission.

The booster housing may be tubular and, in one form of the invention, the printed electronic circuit is printed directly onto an inner surface, or an outer surface, of the booster housing. It is preferred though to print the printed electronic circuit onto a flexible substrate, or onto two or more substrates each of which may be flexible. To provide a degree of protection for the control circuit which is included in the printed electronic circuit, it is preferred that the control circuit is carried on a substrate which, in use, is contained inside the booster housing or at a protected position on the housing. The energy harvesting module is conveniently positioned at a location at which it can be coupled, with ease, to a light emitting source. Without being restrictive the energy harvesting module would thus, normally, be on an outer side of the booster housing.

The igniter may be of any appropriate kind and may comprise a single device or a compound device e.g. a distributed fuse head or the like.

According to a further aspect of the invention the booster component is used together with a booster explosive material which is loaded into the booster housing to make up an operative booster. Preferably the design of the booster housing is such that the loading of the booster explosive material into the booster housing can readily be accomplished under non-factory conditions. This approach substantially facilitates shipping and transport of the booster component, for safety regulations which are generally applicable to explosive materials are then not required to be taken into account.

In a preferred form of the invention the booster explosive material is made from at least two ingredients each of which, on its own, is not hazardous. These ingredients, however, when mixed in a prescribed manner, react with each other and, after a reaction time, can be used effectively in a booster. This approach, although exemplary and preferred, is non-limiting.

The energy which is harvested by the module is used, in response to a control signal, for firing the igniter. It may be desirable however to communicate with the booster before ignition takes place e.g. to verify the status of the booster, to program the firing circuit with a time delay, or for any other purpose. To achieve this objective the booster component may then include or be connectable to a battery which, preferably, is printed. The battery is used for non-firing purposes for typically the energy content of the battery is inadequate to fire the igniter. In that respect reliance is placed on the harvested energy.

BRIEF DESCRIPTION OF THE DRAWINGS

The invention is further described by way of example with reference to the accompanying drawings in which.

DESCRIPTION OF PREFERRED EMBODIMENT

Figure 1:
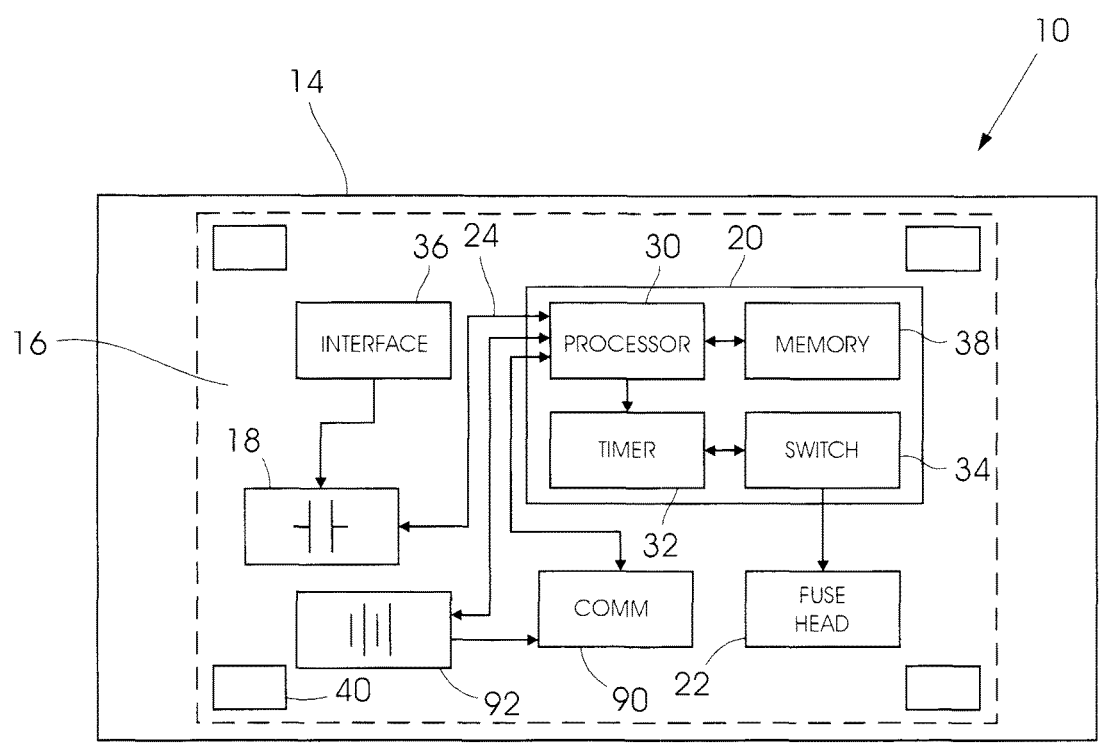
FIG. 1 is a block diagram representation of a printed electronic circuit included in a booster component according to the invention.

FIG. 1 of the accompanying drawings is a block diagram representation of a printed electronic circuit 10 suitable for use in a booster component according to the invention. The printed electronic circuit includes a flexible substrate 14 made from any suitable, tough, non-electrically conductive material as is known in the art. Printed on the substrate are a photovoltaic cell 16 which constitutes an energy-harvesting module, a capacitor 18, a control circuit 20 and a fuse head 22. The photovoltaic cell 16 covers a substantial area of the substrate 14. The cell preferably covers all regions of the substrate 14 not occupied by the elements 18, 20 and 22 nor by interconnecting circuit lines 24 which couple the elements to one another.

The design of the cell 16 is such that, when exposed to light, the cell 16 converts the light into electrical energy at a suitable voltage which is used to charge the capacitor 18. The capacitor 18 is a low-leakage device and is also fabricated using printable electronic circuit printing techniques.

The nature of the control circuit 20 is determined by required operating characteristics and can be finalised at the time printing thereof is to take place. Typically the control circuit 20 includes a processor 30, a timer 32 and a switch 34 which is connected to the fuse head 22. The printed electronic circuit 10 includes an interface device 36. The device 36 allows for communication links between an external source, e.g. a blasting machine (not shown), and the printed electronic circuit 10, particularly the control circuit 20, to be established. The interface device 36 may include a transmitter/receiver which functions at a radio frequency and which is powered by energy drawn from the capacitor 18. Alternatively or additionally the interface device 36 may be based on the use of techniques known in the art which enable a mobile, hand-held device such as a tagger (not shown) to communicate with the interface device 36 using infrared, optical or other suitable operating frequencies. Through the use of the interface device 36 data can be transferred to the processor 30 from an external source, and transferred from the processor 30 to the external source, according to requirement.

The processor 30 may include a memory module 38 which is uniquely encoded i.e. it provides a means e.g. storage of an identifier, whereby the identity of the printed electronic circuit 10 is uniquely specified. This is useful for, inter alia, it allows time and other programming protocols, as are known in the art, to be implemented.

In this example the flexible substrate 14 is formed with a number of locating apertures 40.

Figure 2:
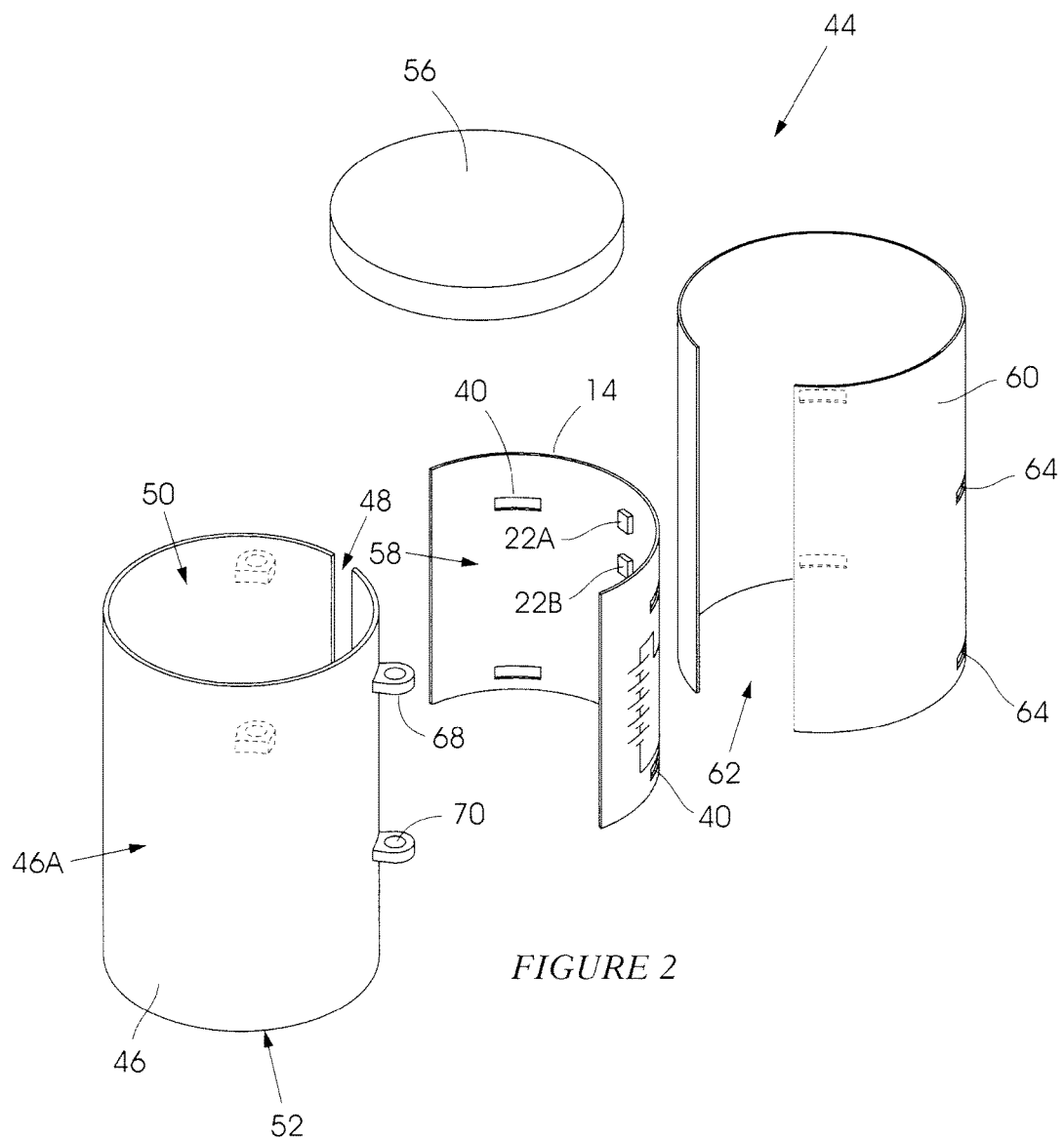
FIG. 2 shows a booster component according to the invention in an exploded configuration and in perspective.

FIG. 2 shows a booster component 44, according to the invention, in an exploded configuration. The component 44 includes a cup-shaped booster housing 46 which has an elongate slot 48 extending from a mouth 50 to a lower end 52 which is closed. The mouth 50 can be sealed by means of a cap 56 which is engageable with the booster housing 46 in a non-slip and secure manner, when required. An interior volume 57 of the booster housing 46 is then substantially completely enclosed.

FIG. 2 shows the flexible substrate 14 folded into the form of a trough. This is readily done for, typically, the material upon which a printable electronic circuit 10 is printed can be made to be flexible. Alternatively the printable electronic circuit 10 can be printed onto a fairly rigid yet resiliently deformable carrier material which is preformed (i.e. before printing of the circuit 10 takes place) into the trough shape shown in FIG. 2.

The fuse head 22, referred to in connection with FIG. 1 is, preferably, a distributed fuse head i.e. it includes a number of fuse head components 22A, 22B etc. which are spaced apart from one another and which are positioned on what, in use, is an inner surface 58 of the substrate 14. The fuse head components are located so that they are positioned in the slot 48, when the curved substrate 14 is placed over an outer surface 46A of the housing 46.

The booster component 44 further includes a flexible protective transparent sleeve 60 which is made from a resiliently deformable thin and transparent plastics material. The sleeve 60 can be resiliently circumferentially expanded as required due to the provision of an elongate relatively large slot 62. The material from which the sleeve 60 is made has a memory and, once an expansive force applied to the sleeve is removed, the sleeve contracts circumferentially automatically due to the memory of the sleeve material. The sleeve is formed with a number of apertures 64 which are respectively brought into register with the apertures 40 when the substrate 14 is placed onto the housing 46, and the sleeve is then engaged with the substrate and the housing 46.

Figure 3:
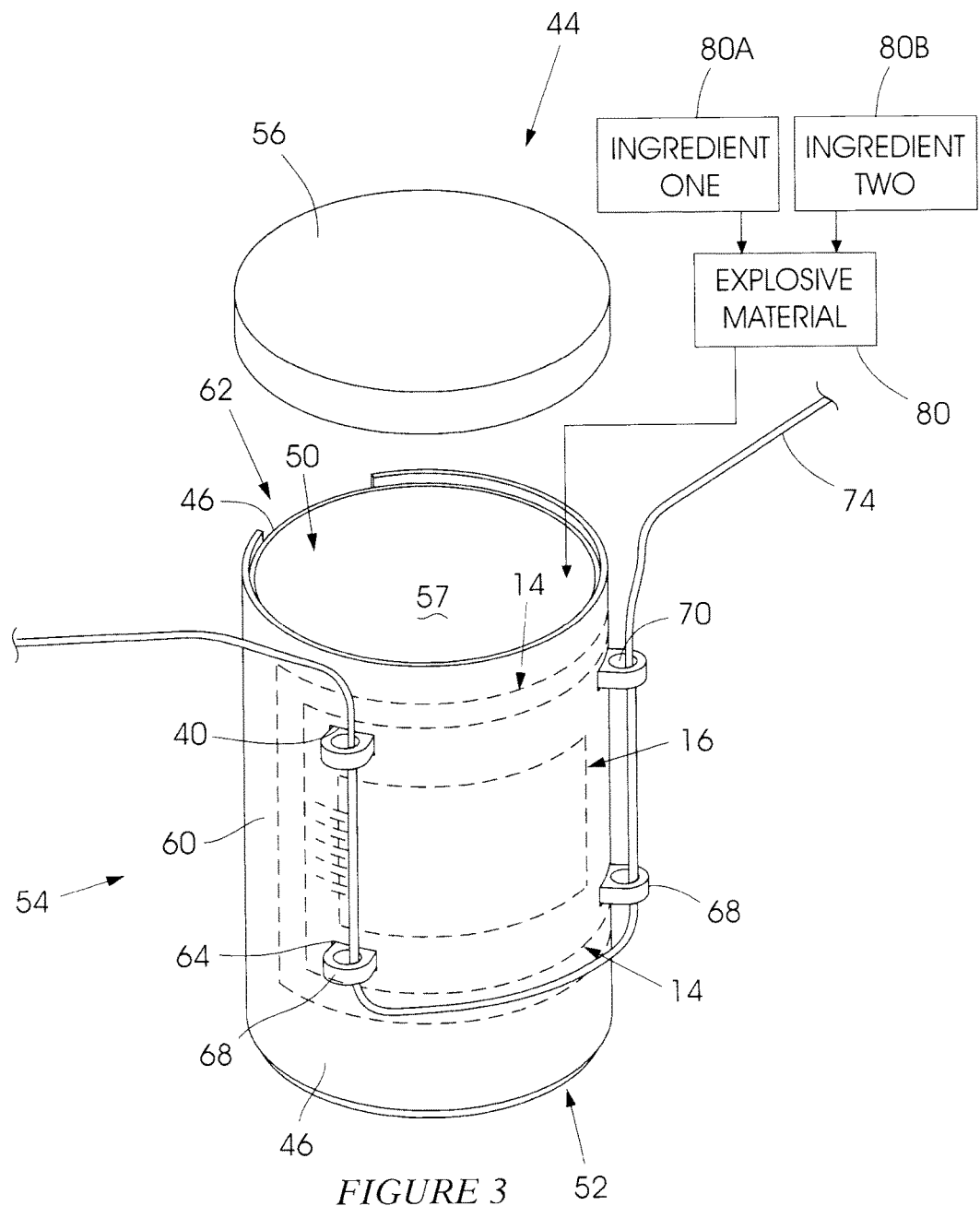
FIG. 3 shows the booster component of FIG. 2 in an assembled condition.

The outer surface 46A of the housing 46 has four tags 68 which respectively pass through registering apertures 40 and 64 and which then present holes 70 on an outer side of the detonator component 44 (when assembled) as shown in FIG. 3.

With the booster component 44 in the assembled state shown in FIG. 3, a light emitting component 74, such as a fibre-optic cable or a shock tube is threaded through the holes 70 to expose a substantial length of the component 74 to the underlying photovoltaic cell 16 included in the circuit 10. The material from which the sleeve 60 is made is, at least partly, light transmissive and, consequently, light emitted by the component 74 impinges directly on the cell 16 with minimal attenuation. The light reacts with the photovoltaic cell and, as is known in the art, electrical energy is produced which is used to charge the capacitor 18.

The booster housing 46 is normally provided in the assembled configuration shown in FIG. 3 but without the component 74 connected thereto.

The tags 68 could have apertures formed with clip shapes so that the component 74 can be slipped into engagement with the holes directly i.e. without being threaded through the holes one after the other.

At an operative site at which blasting is to take place, a booster explosive material 80 is loaded into the interior volume 57 of the booster housing 46 through the mouth 50. The material 80 may be of any appropriate kind. Preferably though the explosive material 80 is made from at least two-ingredients 80A and 80B respectively which are designed so that each ingredient, on its own, is safe and reliable to use. It is only when the ingredients 80A and 80B are correctly mixed with each other and then after a determined reaction period has passed that material 80, formed by the mixed ingredients 80A and 80B, can be ignited.

In use, once the booster housing 46 has been loaded with the explosive material 80, the cap 56 is engaged the mouth 50 and the booster 84 (comprising the assembled booster component 44 which has been loaded with the explosive material 80) can then be deployed into a blast hole, not shown, in a conventional manner. Typically the booster 84 is one of a plurality of similarly constructed boosters (not shown) employed in a suitable configuration at a blast side.

When firing at the blast site is to take place a firing signal is sent to the booster 80 by the light emitting component 74 which, as noted, is typically a shock tube. An advancing propagation front on the shock tube passes over the photovoltaic cell 16 which is included in the printed electronic circuit 10 and light energy, harvested by the cell 16, is converted into electrical energy which is used to charge the capacitor 16. The control circuit 20 is powered by energy drawn from the capacitor 16. The control circuit 20, via the timer 32, can execute a timing interval which can be preprogrammed into the processor 30 through the interface device 36. At the end of the timing interval the switch 34 is closed and energy drawn from the capacitor 16 is discharged into the fuse head 22. In the preferred configuration shown in FIG. 2 the fuse head 16 consists of a number of spaced apart or distributed fuse head components 22A, 22B etc. and each fuse head component is exposed to the explosive material 80 inside the booster housing 46. Firing of the booster 84 then takes place in a conventional manner.

In the preceding description reference has been made to harvested energy which is used to ignite the igniter or fuse head. Prior to firing taking place it may be desirable or necessary for a blasting machine (not shown) under the control of an operator to communicate with the booster 84. A timed delay may be programmed into the timer 22 or a time already loaded may be altered. It may be required to verify the status of the booster i.e. to validate connections etc. to the booster and to ensure that the booster is functional. For this purpose the circuit 10 (refer to FIG. 1) may include a communication module 90 and a battery 92 which is used to power the communication module prior to the energy harvesting process being implemented. The battery 92 may be formed by printing suitable materials onto the flexible substrate 14. The battery 92 may additionally power the processor 30, as appropriate, to allow communications to take place with the booster. Typically the capacity of the battery is adequate to allow communications to take place, as required but is inadequate to cause the igniter to be fired.

The invention claimed is:

1. A booster component which includes a booster housing for a booster explosive material and a printed electronic circuit which is associated with the housing and which includes a module for harvesting energy emitted by an energy source, a storage device for storing energy harvested by the module, an igniter and a circuit, powered by energy drawn from the storage device and responsive to a control signal for firing the igniter, wherein at least a part of the printed electronic circuit is printed directly onto a surface of the booster housing.

2. A booster component which includes a booster housing for a booster explosive material and a printed electronic circuit which is associated with the housing and which includes a module for harvesting energy emitted by an energy source, a storage device for storing energy harvested by the module, an igniter and a circuit, powered by energy drawn from the storage device and responsive to a control signal for firing the igniter, wherein the printed electronic circuit is printed on a substrate which is attached to the booster housing, or which forms part of the booster housing.

3. A booster component according to claim 1 wherein the energy source is a light source.

4. A booster component according to claim 1 wherein the energy-harvesting module includes at least one photovoltaic cell.

5. A booster component according to claim 1 wherein the energy storage device is selected from a printable electronic rechargeable cell, a battery of cells, a super capacitor and an electrical cell.

6. A booster component which includes a booster housing for a booster explosive material and a printed electronic circuit which is associated with the housing and which includes a module for harvesting energy emitted by an energy source, a storage device for storing energy harvested by the module, an igniter and a circuit, powered by energy drawn from the storage device and responsive to a control signal for firing the igniter, wherein the booster housing is tubular and the printed electronic circuit is positioned onto an inner surface, or an outer surface, of the booster housing.

7. A booster component according to claim 2 wherein the substrate is inside the booster housing or is on an outer surface of the booster housing and is covered, at least partly, by a sleeve which is, at least partly, light transmissive.

8. A booster component according to claim 1 wherein the igniter is a distributed fuse head.

9. A booster component according to claim 1 which includes a communication module and a battery for powering, at least, the communication module.

10. A booster component according to claim 9 wherein the battery is formed using a printing technique.

11. A booster which includes a booster component according to claim 1 and a booster explosive material which is loaded into the booster housing.

12. A booster according to claim 11 wherein the booster explosive material is made from at least two ingredients each of which, on its own, is not hazardous but which when mixed in a prescribed manner, react with each other and, after a reaction time, can be ignited.

13. A booster component according to claim 2 wherein the energy source is a light source.

14. A booster component according to claim 2 wherein the energy-harvesting module includes at least one photovoltaic cell.

15. A booster component according to claim 2 wherein the energy storage device is selected from a printable electronic rechargeable cell, a battery of cells, a super capacitor and an electrical cell.

16. A booster component according to claim 2 wherein the igniter is a distributed fuse head.

17. A booster component according to claim 2 which includes a communication module and a battery for powering, at least, the communication module.

18. A booster component according to claim 17 wherein the battery is formed using a printing technique.

19. A booster which includes a booster component according to claim 2 and a booster explosive material which is loaded into the booster housing.

20. A booster according to claim 19 wherein the booster explosive material is made from at least two ingredients each of which, on its own, is not hazardous but which when mixed in a prescribed manner, react with each other and, after a reaction time, can be ignited.

* * * * *